United States Patent
Duignan

(10) Patent No.: US 6,583,381 B1
(45) Date of Patent: Jun. 24, 2003

(54) APPARATUS FOR FABRICATION OF MINIATURE STRUCTURES

(75) Inventor: Michael T. Duignan, Washington, DC (US)

(73) Assignee: Potomac Photonics, Inc., Lanham, MD (US)

(*) Notice: Subject to any disclaimer, the term of this patent is extended or adjusted under 35 U.S.C. 154(b) by 0 days.

(21) Appl. No.: 09/744,173
(22) PCT Filed: May 24, 2000
(86) PCT No.: PCT/US00/09817
§ 371 (c)(1), (2), (4) Date: Jan. 19, 2001
(87) PCT Pub. No.: WO00/72222
PCT Pub. Date: Nov. 30, 2000

Related U.S. Application Data

(60) Provisional application No. 60/135,486, filed on May 24, 1999.

(51) Int. Cl.[7] .......................... C23C 14/28; B23K 26/18
(52) U.S. Cl. .......................... 219/121.69; 219/121.85; 219/121.72; 427/596
(58) Field of Search ................ 219/121.85, 121.69, 219/121.72, 121.71; 427/596, 597, 561

(56) References Cited

U.S. PATENT DOCUMENTS

| | | | |
|---|---|---|---|
| 4,752,455 A | * | 6/1988 | Mayer .......................... 427/597 |
| 4,987,006 A | * | 1/1991 | Williams et al. ............. 427/597 |
| 5,258,366 A | * | 11/1993 | Nagaishi et al. ............. 505/474 |
| 5,389,196 A | * | 2/1995 | Bloomstein et al. .......... 216/66 |
| 5,643,472 A | * | 7/1997 | Engelsberg et al. ........... 216/65 |
| 5,773,188 A | * | 6/1998 | Ellis ........................... 430/201 |
| 6,440,503 B1 | * | 8/2002 | Merdan et al. .............. 427/561 |

* cited by examiner

Primary Examiner—M. Alexandra Elve
Assistant Examiner—Len Tran
(74) Attorney, Agent, or Firm—Rosenberg, Klein & Lee

(57) ABSTRACT

An apparatus is provided for fabrication of miniature structures which includes a substrate, a controllable energetic beam, a deposition layer supported on a material carrier element and a control unit operating the apparatus in either of "material removal" and "material transfer" modes of operation. In the "material removal" mode of operation, the control unit displaces the material carrier element away from an interception path with the energetic beam so that the energetic beam impinges in patterned fashion onto the surface of the substrate and disintegrates the surface material of the substrate. In the "material transfer" mode of operation, the control unit displaces the deposition layer to intercept with the energetic beam so that the material contained in the deposition layer is transferred and deposited on the surface of the substrate in a patterned fashion.

13 Claims, 7 Drawing Sheets

APPARATUS FOR FABRICATION OF MINIATURE STRUCTURES

REFERENCE TO RELATED APPLICATIONS

This utility Patent Application is based on U.S. Provisional Application for Patent (Serial No. 60/135,486) filed on May 24, 1999, and PCT Application Serial No. PCT/US00/09817.

FIELD OF THE INVENTION

The present invention relates to an apparatus and technique for fabrication of a variety of miniature structures such as semiconductor chips, optical, chemical, biological, environmental, physical, electromagnetic detectors/sensors, mechanical and electromechanical elements and actuators, antennae, different electronic components, as well as vias, channels, guides, etc.

More particularly, the present invention relates to an apparatus and technique for fabrication of miniature structures where the Direct Write (additive process) and micromachining (subtractive process) are carried out with and in the same fabrication tool by means of synchronous control and manipulation of elements of the fabrication tool.

Still further, the present invention relates to an apparatus having a control mechanism which operates the fabrication apparatus in either of two modes of operation: "material transfer" and/or "material removal" modes of operation. The additive process, such as Laser Forward Transfer, or Laser Induced Forward Transfer methodologies are carried out during the "material transfer" mode of operation to deposit materials on the substrate surface and to create additive structures such as various detectors, sensors, actuators, semiconductor chips, etc. In the "material removal" mode of operation a subtractive process is carried out resulting in a material removal from the workpiece by means of ablation, evaporation, melting, cutting, drilling, etc. of the workpiece, thus creating channels, guides, vias. During the "material removal" mode of operation, the fabrication tool performs as a micromachining workstation so that the substrate with the structures previously created thereon during the "material transfer" mode of operation may be diced or excised into individual subunits, and can be trimmed or shaped to precise specified values.

Further, the present invention relates to an apparatus and method in which a controllable energy or energetic beam is directed towards a substrate where a material carrier element having a deposition layer formed thereon is displaceably positioned in spaced relationship with the substrate. A control unit synchronously manipulates the material carrier element and the energy beam in accordance with the type of the structure to be manufactured.

In this manner, in a "material removal" mode of operation, the control unit displaces the material carrier element away from interception with the energy beam so that the energy beam impinges onto the surface of the substrate in a predetermined manner and disintegrates the surface material of the substrate to a predetermined depth.

Further, in the "material transfer" mode of operation, the control mechanism displaces the material carrier element into a position intercepting the energy beam so that the energy beam modifies the deposition layer on the material carrier element, and causes transfer and deposition of the deposition material onto the surface of the substrate in accordance with a predetermined pattern.

In both modes of operation, for performing patterned removal of the material from the surface of the substrate or patterned deposition of the material onto the surface of the substrate, the control unit changes the relative position between the energy beam and the substrate in a patterned manner.

BACKGROUND OF THE INVENTION

Miniature structures having electrical components are widely used in a variety of consumer and industrial items, such as TV sets, radios, cars, kitchen appliances, computers, etc.

Due to the need for such miniature structures, such as computer chips, and other mechanical and electromechanical elements, different manufacturing processes have been developed.

Methodologies of manufacture include, among others, additive Direct Write processes such as Laser Forward Transfer (LFT), Matrix Assistant Pulse Laser Evaporation, or Laser Induced Forward Transfer (LIFT) techniques, well-known to those proficient in the miniature structure fabrication art.

In the course of these techniques, a material from the deposition material source is transferred towards a substrate and is deposited thereon in accordance with a predetermined pattern either to manufacture a single structure or a plurality of structures on the same substrate. Simultaneously, a subtractive process is employed using laser energy to ablate, evaporate, melt, cut, drill, or otherwise remove material from the workpiece. In this manner, channels, guides, or vias can be laser milled or drilled. Additionally, a substrate with a plurality of structures may be excised into individual subunits, trimmed or shaped.

Although both additive and subtractive processes are well-developed and known in the miniature structures manufacturing industry, there is a drawback which still exists resulting from the necessity to transfer the substrate with deposited structures thereon from one area (where the additive Direct Write process takes place) to a micromachining workstation, or conversely, from a micromachining station where the surface cleaning takes place to a material deposition area.

During this substrate transfer from one location to another, physical damage to the workpiece may be found, the workpiece may be contaminated, or areas exposed during surface cleaning may be reoxidized, thus substantially reducing yield of the high quality devices.

Additionally, transfer of the workpiece from one location to another requires additional labor effort and precaution to protect the workpiece from being damaged or polluted, thus further increasing the costs and complexity of the manufacturing process and equipment.

Accordingly, despite the use of the existing manufacturing equipment and techniques for fabrication of miniature structures, a long felt need has arisen and exists for equipment and techniques free of the disadvantages of the prior art.

SUMMARY OF THE INVENTION

It is therefore an object of the present invention to provide a tool and method for fabrication of miniature structures which carry out both additive and subtractive processes in and with the same apparatus.

It is a further object of the present invention to provide an apparatus for fabrication of miniature structures in which a control unit operates the apparatus in either a "material removal" and/or "material transfer" mode of operation. In this manner by using the same apparatus, either a deposition of a material on the surface of the substrate can be effected or removal of the material from the surface of the substrate can be performed.

It is an object of the present invention to provide an apparatus for manufacturing of miniature structures in which during a "material removal" mode of operation, the control unit permits direct impingement of the energy beam onto the surface of the substrate so that the energy beam "scans" the surface of the substrate in a patterned fashion and removes material from the surface of the substrate in accordance with the type of structure to be created.

An additional object of the present invention is to provide an apparatus and method in which, during the "material transfer" mode of operation, the control unit moves a material carrier element into an intercepting path with the energy beam. When the energy beam impinges on the deposition layer on the material carrier element such causes transference of the material contained in the deposition layer to the surface of the substrate and the material is deposited thereon in a patterned manner in accordance with the type of the structure to be created.

It is still a further object of the present invention to provide an apparatus for fabrication of miniature structures created by equipment which includes a source for the energetic beam, a substrate, a material carrier element having a deposition layer thereon, and a control unit which synchronously manipulates the material carrier element and the energetic beam in accordance with the type of the structure to be created and the type of operation (additive or subtractive) to be performed. In carrying out an additive process, the material carrier element is displaced into interception with the energy beam, and the relative disposition between the energy beam and the substrate is changed in a patterned fashion. In carrying out a subtractive process, the material carrier element is displaced away from interception with the energy beam, and the relative disposition between the energy beam and the substrate is controlled in a patterned fashion.

In accordance with the present invention, an apparatus for fabrication of miniature structures includes a substrate, a source of energy capable of generating an energetic beam directed towards the substrate, a material carrier element displaceably disposed in a gap formed between the source of energy and the substrate, a deposition layer supported on the surface of the material carrier element facing the substrate, and a control unit operatively coupled to the source of energy (and/or to the substrate) for regulating parameters of the energy or energetic beam. The control unit controls the relative interposition between the energy beam and the substrate in accordance with a predetermined pattern. The control unit is also operatively coupled to the material carrier element for manipulating the same within the gap formed between the source of energy and the substrate by moving the material carrier element either into a position corresponding to the "material removal" mode of operation or to a position corresponding to the "material transfer" mode of operation.

In the position corresponding to the "material removal" mode of operation, the material carrier element is displaced away from intercepting the energy beam, in order that the energy beam has a direct access or clear path to the substrate and impinges upon the surface of the substrate at a predetermined location. This causes disintegration of the material of the surface of the substrate to a predetermined depth and subsequent removal of the material from the predetermined location on the substrate.

When the material carrier element is in the "material transfer" mode of operation, the material carrier element intercepts the energy beam which impinges upon the material carrier element, thus causing modification of the deposition layer at a predetermined location or point of impingement. The material contained in the deposition layer is then transferred from the material carrier element to the substrate for deposition thereon in accordance with a predetermined pattern.

In order to remove material from the substrate or to deposit material onto the substrate, the control mechanism performs control of the source of the energy beam by changing relative disposition of the energy beam with respect to the substrate, by regulating size and shape of the cross-section of the energy beam, and by regulating a fluence or movement of the energy beam.

Although different energy beams may be used in the apparatus of the present invention such as laser beams, ion beams, and electron beams, a pulsed UV excimer laser is thought to be preferred among others.

Preferably, the deposition layer on the material carrier element includes a material to be deposited (powder, metal, composite, alloy, ceramic, etc.), and/or a vaporizable substance.

Further, the present invention includes a method for fabrication of miniature structures, which includes the steps of:

providing a fabrication tool which carries out both additive and subtractive processes. The apparatus includes a substrate, a controllable energetic beam directed towards the substrate, a deposition layer supported on a material carrier element, and a control unit operating the fabrication tool in either a "material removal" and/or a "material transfer" modes of operation. In the "material removal" mode of operation, the control unit displaces the material carrier element away from intercepting the energy beam and controllably changes the relative position between the energy beam and the substrate, thereby removing disintegratable material from the surface of the substrate in accordance with a predetermined pattern.

In the "material transfer" mode of operation, the control unit maintains the material carrier element in an interception path with the energy beam and controllably changes the relative position between the energy beam and the substrate, thereby transferring material contained in the deposition layer onto the substrate for deposition thereon in accordance with a predetermined pattern.

The "material removal" mode of operation may then be further initiated after the "material transfer" mode of operation for cutting the substrate into separate units with each having a created structure thereon and trimming the structures to required dimensions. In cleaning the surface of the substrate before the Direct Write process is performed, the "material removal" mode of operation is initiated prior to the "material transfer" mode of operation.

In the "material removal" mode of operation, electrical vias, micromachined channels, guides, and other contours may be created. In the "material transfer" mode of operation, a variety of electrical components, such as semiconductor chips, sensors, detectors, and other components, may be fabricated.

These and other novel features and advantages of this invention will be fully understood from the following detailed description of the accompanying drawings.

DETAILED DESCRIPTION OF THE PREFERRED EMBODIMENTS

Figure 1:
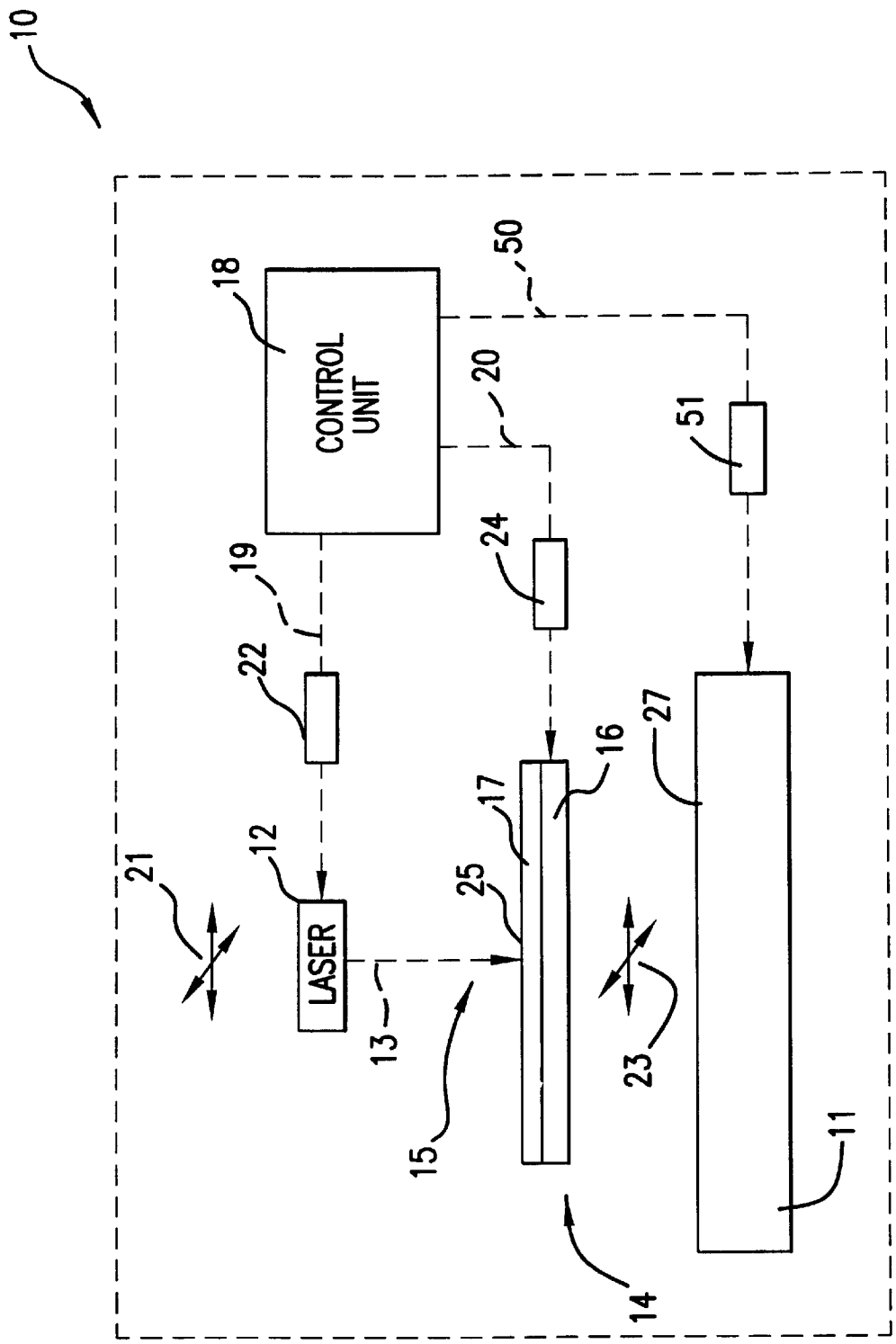
FIG. 1 is a schematic representation of the operational principles of the apparatus for fabrication of miniature structures of the present invention.

Referring to FIGS. 1–6, the apparatus 10 of the present invention for fabrication of miniature structures includes a substrate 11, a source of energy 12 capable of generating an energy or energetic beam 13, a material carrier element 14 displaceably disposed in a gap 15 formed between the source of energy 12 and the substrate 11, a deposition layer 16 supported on the backing material 17 of the material carrier element 14, and a control unit 18 operatively coupled to the source of energy 12 through the communication link 19 and to the material carrier element 14 through the communication link 20. Alternatively, the control unit 18 may be operatively coupled to the substrate 11.

Through the communication link 19, the control unit 18 actuates the source of energy 12 to generate the energy beam 13, regulates the parameters of the energy beam 13 such as fluence, shape and size of the spot (cross-section of the beam), as well as changes relative position between the energetic beam and the substrate in a patterned fashion.

In this manner, the control unit 18 "scans" the beam 13 over the surface of the substrate 11 either by moving the source of energy 12 in X-Y direction shown by arrows 21, or by changing angular relative disposition of the energy beam 13 with regard to the substrate 11 in a patterned fashion. In order to change a relative disposition between the energy beam 13 and the substrate 11, the control unit 18 can, alternatively, move the substrate relative to the immovable beam 13.

In order to provide the control unit 18 with the function of manipulating the energetic beam 13, the communication link 19 includes a mechanism 22 (best shown in FIGS. 1, 3 and 5) translating the electrical signal transmitted from the control unit 18 into mechanical displacement of the source of energy 12 as well as monitoring a position of the source of energy 12.

Through the communication link 20, the control unit 18 is capable of manipulating the material carrier element 14 within the gap 15 along the directions shown by the arrows 23 so that the material carrier element 14 may be displaced either away from the interception with the energy beam 13, or to the position intercepting the beam 13.

A mechanical displacement unit 24 is included in the communication link 20 to translate the signal generated by the control unit 18 into the mechanical displacement of the material carrier element 14 along the directions shown by the arrows 23.

Figure 4:
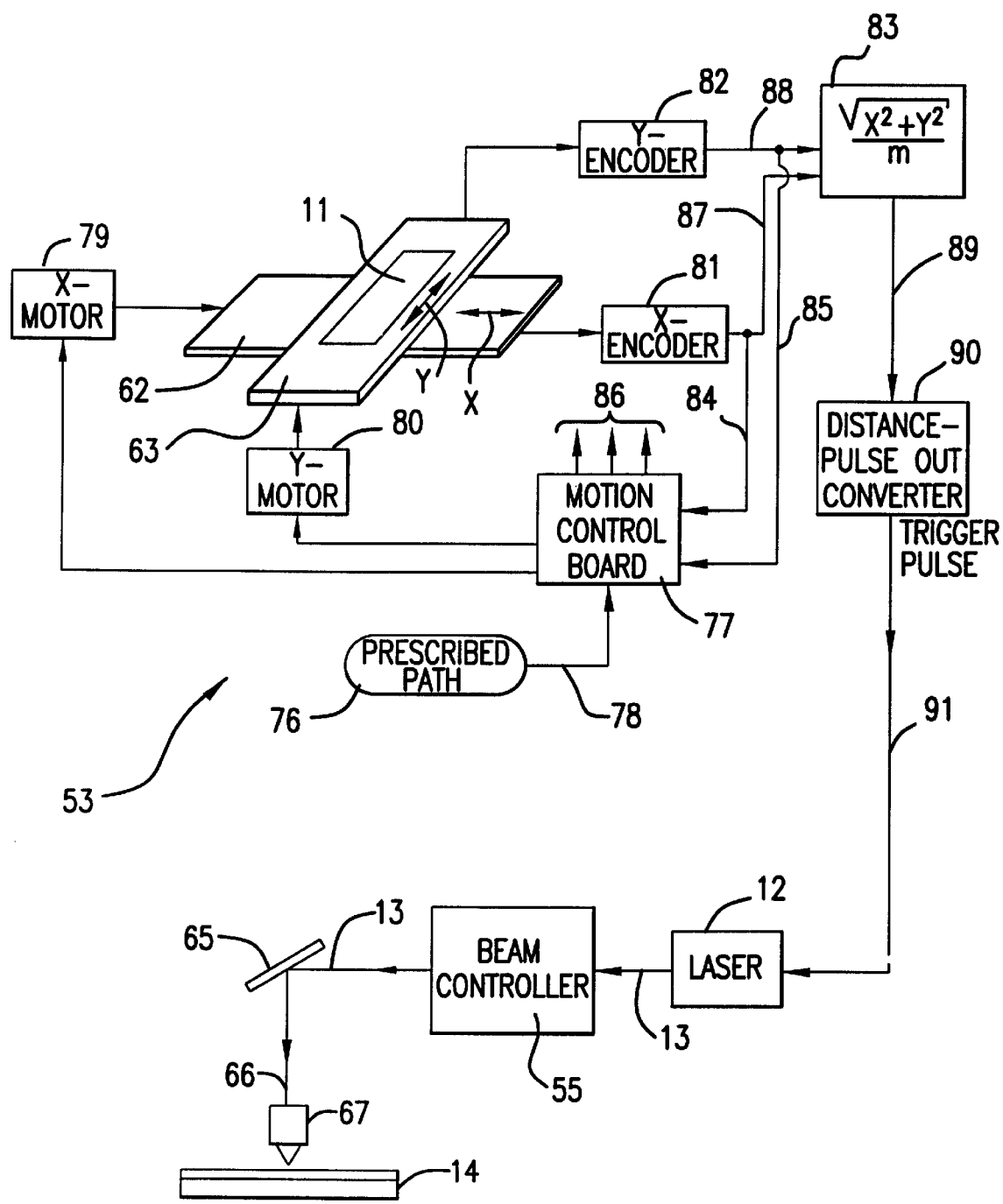
FIG. 4 is a block diagram of a controller subsystem of the apparatus of the present invention coordinating the substrate motion and laser activation-deactivation.

As best shown in FIGS. 1 and 4, the control unit 18 communicates with the substrate 11 through a communication link 50. A substrate motion mechanism 51 is included into the communication link 50 for mechanically displacing the substrate 11 according to a prescribed path and for monitoring the substrate position (as will be described in detail in further paragraphs).

Figure 2A:
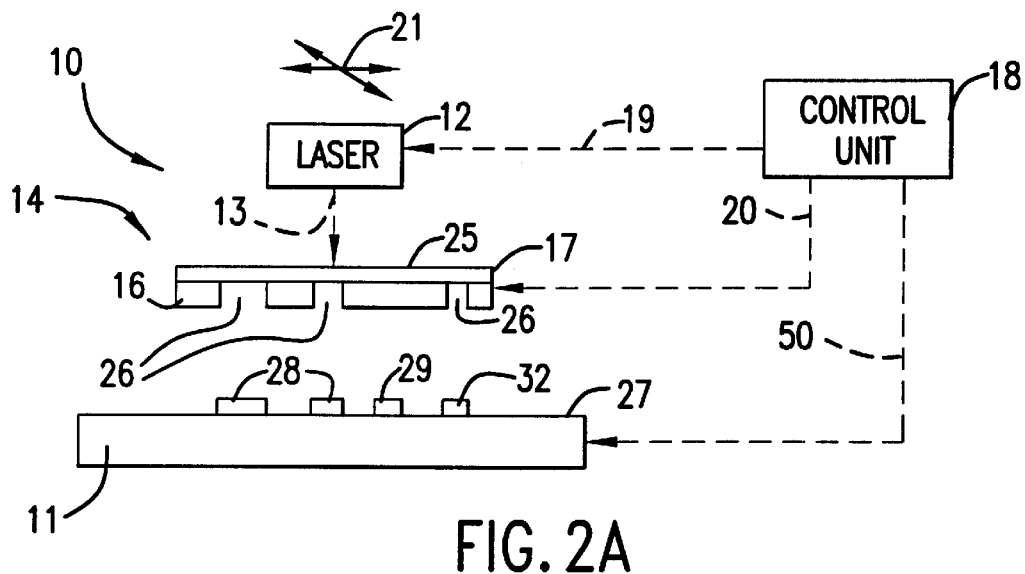
FIG. 2A is a schematic representation of the "material transfer" mode of operation of the apparatus for fabrication of miniature structures of the present invention.

The control unit 18 operates the apparatus 10 of the present invention in two modes of operation: "material removal" mode of operation and "material transfer" mode of operation. As best shown in FIG. 2A, in the "material" transfer mode of operation, the control unit 18 maintains the material carrier element 14 in an intercepting path with the energy beam 13 and changes the relative disposition of the source of energy 12, i.e., the beam 13, with respect to the substrate in a patterned manner. In this manner, the energy beam 13 impinges upon the material carrier element 14 at the surface 25 and causes modification of the deposition layer 16 at predetermined spots or locations 26 from which material contained in the deposition layer 16 is deposited onto the surface 27 of the substrate 11 in a predetermined patterned fashion to form deposited structures 28. The location of the islands (deposited structures) 28 substantially corresponds to positions of the predetermined spots 26 of the deposition layer 16.

If deposition of a material different from that contained in the deposition layer 16 is required for the fabrication of the miniature structures, another deposition layer on a material carrier element 14 may be introduced into the gap 15 and the deposition process, i.e., "material transfer" repeated.

For the sake of clarity, the process of the present invention is described with a single material carrier element 14 and with the single deposition step carried out during the "material transfer" mode of operation, although a plurality of material carrier elements 14 with different deposition layers 16 may be used. A plurality of deposition steps may also be sequentially performed in the apparatus in accordance with the techniques described in the present invention.

As shown in FIG. 2A, the substrate 11 may have on the surface 27 thereof, a prior deposited island 29 created either in the previously performed "material transfer" mode of operation, or created by some other technique known to those skilled in the art.

Figure 2B:
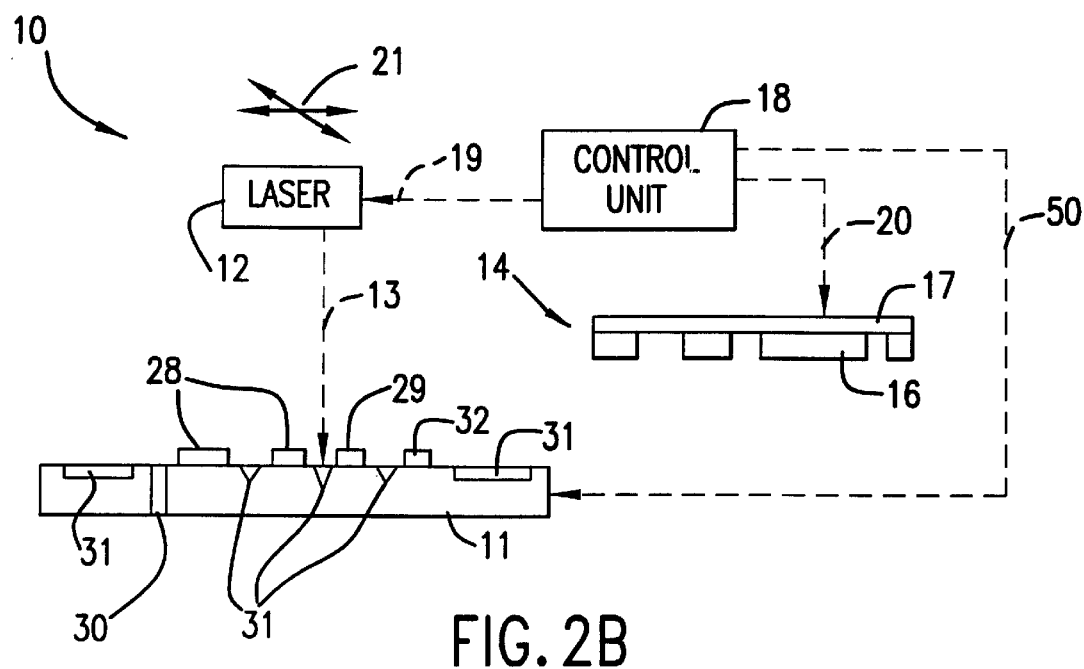
FIG. 2B is a schematic representation of the "material removal" mode of operation of the apparatus for fabrication of miniature structures of the present invention.

When the additive step, i.e., "material transfer" has been performed, the control unit 18 changes the mode of operation to the "material removal" mode, shown in FIG. 2B. In the "material removal" mode of operation, a subtractive process takes place in which the control unit 18 removes the material carrier element from an intercepting path of the energy beam 13 in order to allow the energy beam 13 to directly impinge on the surface 27 of the substrate 11 in a patterned manner. When needed, in accordance with the type of miniature structures to be manufactured, the prior deposited island 29, as well as the deposited structure 32 may be machined.

The "material removal" and "material transfer" modes of operation can be performed in different sequences. For example, the material removal mode of operation may be performed first to ablate and clean the surface 27 of the substrate 11 before any deposition step is performed. After the surface 27 is prepared in a patterned fashion, the control unit 18 sets the "material transfer" mode of operation, and the deposition step takes place.

Alternatively, the "material transfer" mode of operation may be performed initially so that deposited structures 28 and 32 are created on the surface 27 of the substrate 11 and then "material removal" mode of operation is performed for different purposes, i.e., to machine the surfaces of the structures 29 and 32, to make micromachined through vias 30, or different channels and guides 31. Additionally, the substrate 11 may be separated into separate units, each having one or several deposited structures 28, 29, and 32, depending on the type of the miniature structure to be manufactured.

In the apparatus 10 of the present invention, the source of energy 12 is a source of patterned energy which is capable of generating an energetic beam such as ion beam, electron beam, or a laser beam capable of patterned displacement with relation to the substrate 11. The laser may be an ultraviolet laser, such as an excimer laser, which may be pulsed preferably at a rate about 10 Hz with a pulse width shorter than 10 $\mu$sec.

The penetration of UV lasers is generally very shallow with respect to most materials (approximately 500 angstroms) and is extremely useful for surface annealing and sintering of particle composites as well as surface pretreatment and cleaning.

If the energy beam is a UV laser beam, then the modifiable material carrier element 14 is formed of a material composition which is transparent to the ultraviolet radiation in order to allow the patterned energy to reach either a deposition layer 16 on the material carrier element 14 or the substrate 11 subject to the positioning of the element 14. The deposition layer 16 may include materials to be deposited such as powders, metals, composites, alloys, ceramics, and a vaporizable substance which may also include a binder, a molecular precursor, and/or a solvent. The vaporizable substance rapidly decomposes when exposed to the energy beam 13 to propel the other constituents on the deposition material to the substrate 11.

Powders of the deposition layer 16 may be formed of a distribution of powder sizes to form a closely packed matrix. Molecular precursors contained in the deposition layer may react to reduce the externally generated densification energy (thermal or optical) or have an exothermic reaction when activated from the patterned energy source.

The uniqueness of the apparatus of the present invention is the use of direct write and laser micromachining capabilities with a minor perturbation of inserting and manipulating the material carrier element 14 into the gap 15 formed between the source of energy 12 and the substrate 11. Thus, the apparatus of the present invention has all the capabilities of depositing systems and of laser micromachining systems, so that the apparatus 10 can drill holes for vias, ablate and pattern substrates, clean and anneal the surfaces of substrates as well as deposited films.

The apparatus and method of the present invention allows rapid switching between the "material transfer" and "material removal" modes of operation that is particularly important in a large scale direct written circuits. With an in situ laser micromachining capability, individual devices can be written and trimmed as necessary to meet rigid specifications of advanced technologies. The apparatus and method of the present invention is applicable to a wide range of materials, and is built on well-established foundation of laser micromachining which is computer controlled and CAD/CAM compatible.

The system has a controlled environment, including a controlled atmosphere (oxidizing, reducing, or inert), temperature and pressure, and may be operated at ambient pressure and temperature. The combination of controlled atmosphere and minimized time between pattern cleaning and subsequent deposition greatly improves adhesion between the deposited material and the surface 27 of the substrate 11. It also largely avoids damage to other structures which might result from the energy beam during cleaning.

The technique and apparatus of the present invention can be used with a rough preliminary alignment of the element in the system and may be carried out without registration marks. This is due to the fact that all the fabrication which requires extremely accurate alignment is accomplished without removing the substrate from the tool. As the system uses both a patterned additive and subtractive process in a single machine, the product of the system of the present invention can be mechanical, electromechanical, sensor, electrical devices (resistors, capacitors, sensors, inductors, antennas, batteries, as well as a wide variety of electrical and electromechanical structures. Additionally, holes, vias, waveguides, registration marks, gratings, scribe lines, etching, trimming, and cleaning processes may be accomplished.

The present invention provides a unique implementation of both, an additive and subtractive direct write processes in a single machine with the ability to create complex circuits or structures in a conformal manner on virtually any substrate. The additive process may be laser forward transfer (LFT) process, such as matrix assisted pulse laser operation, or laser induced forward transfer (LIFT) process.

In the subtractive mode ("material removal" mode of operation) the apparatus 10 may act as a micromachining workstation, utilizing laser energy to ablate, evaporate, melt, cut, drill, or otherwise remove material from the workpiece. LFT deposited or otherwise existing structures can be trimmed or shaped to precise dimensional values. In the writing mode, the laser might expose positive or negative resist, epoxies, or other sensitive materials in complex patterns with high spatial resolution. Such a capability permits stereolithographic fabrication of three-dimensional structures. In total, the apparatus and the technique of the present invention are easily and flexibly customized, robust, broad in choice of materials and substrate, and deposition conditions, such as temperature, pressure, and cover gas.

The apparatus of the present invention has the modified or removable material carrier element 14 and thus possesses the ability to accomplish pattern tasks such as laser surface clean as well as direct deposit of metals, ceramics, polymers, and much more in situ, in air and at room temperature.

The spatial resolution of most LDW and LFT techniques is generally limited by the obtainable laser spot size or shape and the precision of the motion system or beam steering mechanism. Using LFT, the Applicants have demonstrated gold lines having a width less than 8 microns. Written features have been subsequently trimmed with single micron precision.

By adjustment of the laser spot size and/or shape, the size and shape of the written features may be varied. For example, a 10 micron wide conducting line may be written followed by a 50 micron contact pad without any tool change. The apparatus of the present invention has the potential to obtain write speeds of meters per second while exacting position tolerances to approximately one micron. Mechanical techniques such as Micropen or inkjet cannot match this combination of speed and precision.

The apparatus of the present invention allows for a wide scope of materials to be deposited including materials that are completely insoluble. Very high or very low melting materials, metals, oxides, ferrites, even sensitive polymers are applicable using this technique.

During the process of making a miniature structure in the fabrication tool of the present invention, the control unit 18 controllably changes the relative position between the energy beam 13 and the substrate 11 to remove a pattern of removable material from the surface of the substrate; and then without removing the substrate from the tool, controllably changes the relative position between the energy beam 13 and the substrate 11 to transfer a pattern of depositable material to the substrate 11.

The modifiable material carrier element 14 which supports the deposition layer 16 is capable of being displaced from intercepting the beam 13 thus allowing the beam 13 to pass to the substrate 11 without affecting the relative position between the energy beam 13 and the substrate 11. The relative position between the substrate 11 and the beam 13 is controlled by the patterning device (the control unit 18) and alignment is unaffected by changing the mode of operation ("material removal" and "material transfer" modes of operation). Since both operations are accomplished in a single machine the substrate 11 remains in place and possible problems, such as misalignment, contamination, or damage which result from removing a substrate from a tool, are avoided.

The short absorption depths in most materials and the small minimum spot or feature size (proportional to the wavelength) give ultraviolet lasers many advantages for both LFT and laser machining processes. Most resists and optically cured epoxies rely on UV exposures as well. The combined capability to exploit all of these technologies are inherent in the design of the machine.

In the apparatus of the present invention, and in accordance with the principles and technique of the present invention, the resistors created on the surface of the substrate can be trimmed to value, RF filter networks tuned, and defects, such as shorts, may be removed.

By sliding the material carrier element away from interception with the laser beam and by adjusting the UV laser fluence to approximately 1 $J/CM^2$ or greater, the apparatus 10 is transformed into a machine whose function is essentially the opposite of the direct write technology process, i.e., a micromachining workstation. Vias through the substrate can be drilled with micron precision. Channels for positioning external contacts or laying subsurfaces components can be excavated with ease. Microfluidic structures, functioning as chemical sensors or biological agent detectors, can be embedded directly in the same substrate. By decreasing spot fluence to approximately 100 $MJ/CM^2$ or less, the ablation rate will drop to zero but may still be more than sufficient to expose the sensitive materials.

The "material removal" and "material transfer" modes of operation can change between different materials as quickly as the materials carrier elements are mechanically translated into the optical path. The apparatus of the present invention uses an optically based approach, and thus it lends itself to several in situ optical diagnostics, e.g., ellipsometry, FTIR, optical pyrometry, etc.

The advantages of the fabrication technique of the present invention have been attained due to the design of the apparatus 10, and particularly due to a functional performance and operational approach of the control unit 18, best shown in FIGS. 3–7. The control unit 18 coordinates all aspects of deposition/ablation process;

provides interfacing for an operator control and monitoring;

monitors all critical subsystems (including optical systems) of the apparatus 10 for quality control and safety;

provides communication with external systems and data bases, both internal and external; and provides for compatibility with CAD/CAM control.

Figure 3:
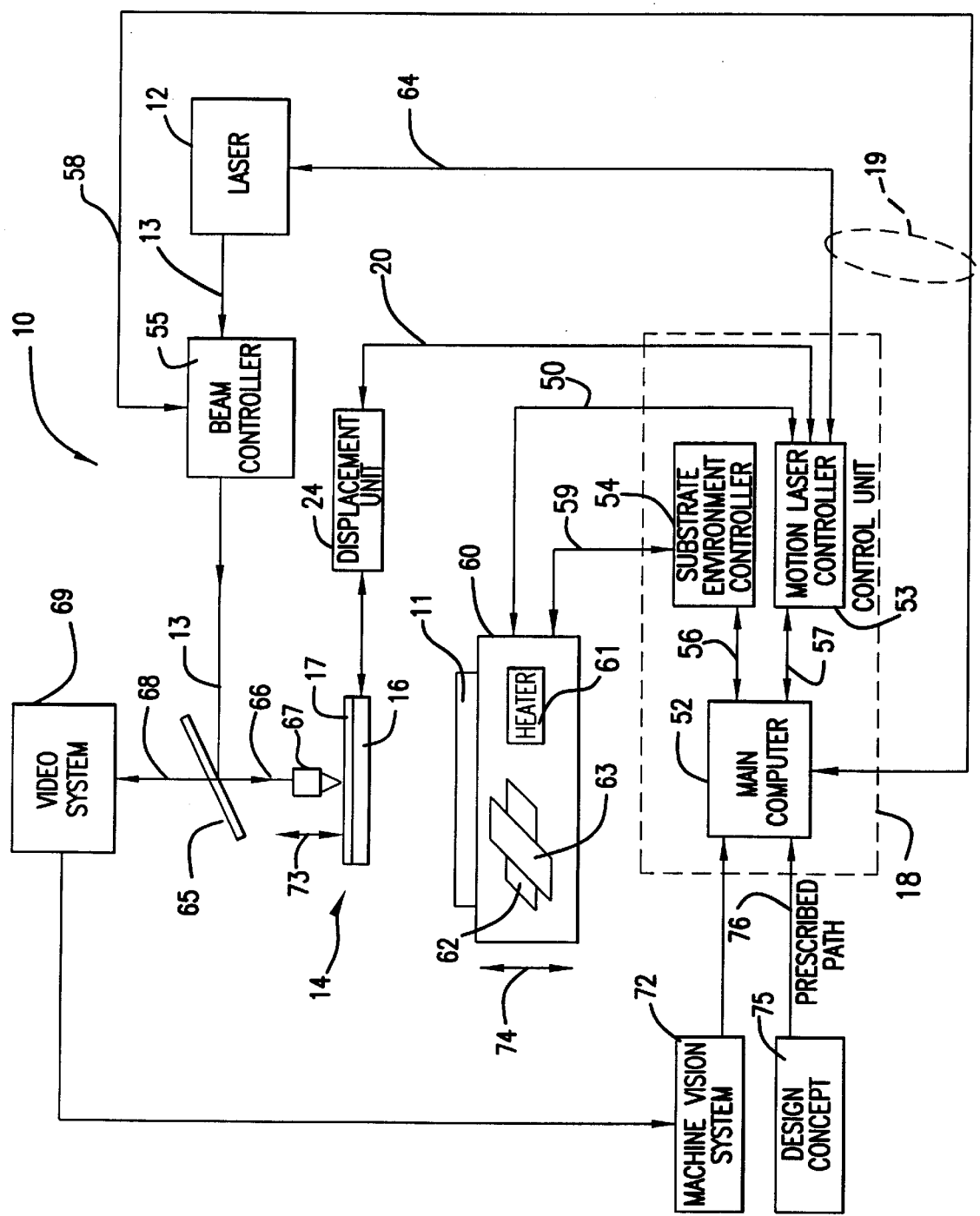
FIG. 3 is an overall block diagram of the apparatus of the present invention.

Referring to FIG. 3, showing the overall block diagram of the system of the present invention, the control unit 18 includes a main computer 52, motion/laser controller 53, substrate environment controller 54, and a beam controller 55. The main computer 52 interchanges data with the substrate environment controller 54 through bi-directional channel 56, and with the motion/laser controller 53 through the bi-directional communication channel 57.

The motion/laser controller 53, is external or internal to the main computer 52, provides accurate (approximately 1 micron) dynamic closed loop position control of the substrate, material carrier element position, and scanning laser beam. The motion-laser controller 53 moves substrate with high speed (up to 1 meter per second) and accuracy (approximately 1 micron) as well as provides for smoothness of travel for patterned deposition of ablating micromachining. Also, the main computer 52 communicates with the beam controller 55 through the bi-directional communication channel 58.

The substrate environment controller 54 is bi-directionally coupled through the communication link 59 to a substrate fixture 60 supporting the substrate 11 thereon. The substrate fixture 60 along with substrate environment controller 54 provides for holding the substrate reliably, keeps it at required level, controls its temperature as well as atmosphere. The fixture 60 includes a temperature control heater block 61 which is controlled in a closed loop fashion by the substrate environment controller 54 for controlling deposition conditions of the system 10.

The fixture 60 includes stages 62 and 63, best shown in FIGS. 1 and 4, which being controlled by the motion/laser controller 53, provide for a required displacement of the substrate 11 in accordance to a prescribed path, as will be described in detail in further paragraphs with reference to FIG. 4. For controlling and monitoring the displacement and position of the substrate 11, the bi-directional communication link 50 operatively couples the stages 62 and 63 of the substrate fixture 60 with the motion/laser controller 53 to convey control signals to the fixture 60 and readings of the position to the motion/laser controller 53.

The motion/laser controller 53 further communicates with the material carrier element 14 through the bi-directional communication channel 20 which has included therein the mechanism 24 responsible for mechanical displacement of the material carrier element 14 either into intercepting position with the laser beam 13 (in the "material transfer" mode of operation) or away from interception with the laser beam 13 (in the "material removal" mode of operation). The mechanism 24 also changes a position of the material carrier element with regard to the laser beam 13 according to the prescribed path for attaining the effective utilization of the depositable material of the deposition layer 16, deposition of a specific depositable material contained in the deposition layer 16, and deposition of the depositable material on an aimed area of the substrate 11. Depending on the type of the material carrier element 14, the mechanism 24 has a distinctive design features adapted for the particular type of the material carrier element, but which in any event, mechanically displaces the material carrier element 14 as prescribed by the motion/laser controller 53 through the channel 20. The mechanism 24 may include "reel-to-reel" mechanism, spinning-sliding vacuum system, or other motion actuating mechanisms.

The control unit 18, as can be seen in FIG. 3, is operatively coupled to the laser system 12 through the communication channel 19 which includes the communication channel 58 for providing coupling between the main computer 52 and the beam controller 55, and the communication channel 64 for providing a bi-directional coupling between the motion/laser controller 53 and the laser 12, as will be described in detail further with reference to FIGS. 5 and 6.

The laser 12 provides focusable pulsed energy source serving to:

transfer material from the deposition layer 16 to the substrate 11 in the "material transfer" mode of operation;

ablatively remove the material from the surface of the substrate 11 in the "material removal" mode of operation;

remove foreign material from the substrate and/or prepare and activate the substrate surface before or after deposition in the "material removal" mode of operation, particularly "cleaning" mode of operation; and shape and refine deposited or existing structures to desired dimensions or values in the "material removal" mode of operation, particularly "laser trimming" mode of operation.

As discussed in the previous paragraphs, the ultraviolet pulsed laser is preferred due to superior ablation characteristics for many materials. Specifically, all solid state frequency tripled neodymium vanadate lasers (radiating at approximately 355 nm), and frequency quadrupled energy laser (radiating approximately at 266 nm) are preferred because they offer high repetition rates, short pulses, sufficient beam quality, high average power, and superior reliability at low maintenance. The laser beam 13 generated by the laser 12, is controlled by the beam controller 55 under the overall control and monitoring of the main computer 52. As disclosed in previous paragraphs, the beam control is embedded in the system 10 of the present invention in order to deliver the laser beam of the desired optimal laser spot size, shape, and fluence to the material carrier element 14 or to the surface of the substrate 11. Beam shape and size determines the resolution and pattern of the deposition or ablation. Once the shape, size and fluence of the laser beam 13 has been attained, the laser beam impinges upon the splitter 65 whereat the laser beam 13 splits into a beam 66 directed to the objective 67 which further focuses the beam 66 and directs the same to either the surface of the material carrier element 14 or to the surface of the substrate 11. The mirror splitter 65 is a highly reflective at laser wavelength but transparent for invisible spectrum for the video system 69. Another portion of the laser beam 13, particularly the beam 68, is directed by the splitter 65 to a video system 69 which includes a video microscope/video camera 70 and a video monitor 71, best shown in FIG. 5. The signal from the video microscope/video camera 70 is supplied through the line 72 to a machine vision system 72 for image capture and processing. The video system/machine vision system permits an operator to accurately position substrate for registration and scaling with existing pattern;

to measure and inspect the substrate; and to facilitate leveling, focusing and displacement of the substrate and the objective 67 in the direction shown by arrows 73 and 74. The optical subsystem of the apparatus 10 of the present invention which includes the video system 69, video microscope/video camera 70, video monitor 71, and the machine vision system 72 is a well-known machine vision technique and is not intended to be described herein in further detail. The data from the machine vision system 72 are transmitted to the main computer 52 for storing, further processing, and for communication with the motion/laser controller 53 through the communication channel 57 for further control of the relative disposition between the elements of the system 10, as well as actuation-deactuation of the laser 12.

Referring now to FIG. 4, showing a block diagram of the substrate motion/laser controller 53 for substrate motion and laser activation-deactivation control, the motion/laser controller 53, either external or internal to the main computer 52, provides accurate (approximately 1 micron) dynamic closed loop position control of the substrate. In this manner, the controller 53 monitors real time position of the substrate and coordinates the same with generating of laser pulses so that the laser pulses can be triggered with very high alignment accuracy.

It is clear that if the laser beam is delivered at constant repetition rate to either the material carrier element, or the substrate, the pulses tend to "pile up" during acceleration and deceleration of the stages 62, 63, or mechanical displacement mechanism 24, or laser beam displacement mechanism (to be discussed further in detail with the reference to FIG. 5) and makes deposition and ablation depth control difficult. To obviate these unwanted phenomena, the actuation of the laser is to be coordinated with deposition of the substrate, laser beam, and/or material carrier element in real time fashion. As best shown in FIG. 4, the main computer 52, through the motion-laser controller 53, transmits signals representative of a prescribed path (received from the "Design Concept" block 75 of the FIG. 3) which is a CAD/CAM developed design concept for layout of miniature structures on the substrate or micromachining layout) is supplied to the motion control board 77 via a channel 78. The motion control board 77 in accordance with the prescribed path controls an X-motor 79 and a Y-motor 80 to force the stages 62 and 63 carrying the substrate 11 to move the same in required direction a required distance. At the same time, an X-encoder 81 is coupled to the X-stage 62, and the Y-encoder 82 is coupled to the Y-stage 63 for measuring X and Y displacements of the stages 62, 63 and translating them into the format understood by the motor control board 77 and the processing block 83. The data from X-encoder 81 and Y-encoder 82 are supplied through the channels 84 and 85, respectively to the motion control board for being processed and used for generating various control signals outputted through outputs 86. These control signals may be further transmitted to the optical system of the laser for controlling the laser shutters, laser optical zoom, aperture selection, etc.

Simultaneously, the data corresponding to X and Y displacements of the stages 62 and 63 are transmitted from the X-encoder 81 and Y-encoder 82 through the communication links 87 and 88, respectively, to the processing block 83 wherein the X and Y displacements are processed and calculated according to the formula $$\left(\frac{X^2+Y^2}{m}\right),$$

wherein X is a displacement of the stage 62, Y is a displacement of the stage 63 and m is an integer defining the number of pulses for each displacement vector. The data from the processing block 83 is output through the channel 89 to a "distance—to pulse out" converter 90. The converter 90 thus receives vector displacement increment and in response thereto, generates trigger pulse which is transmitted to the laser 12 through the line 91 for actuatingdeactuating the laser 12. Thus, the laser 12 generates laser beam 13 once a required displacement of the substrate 11 has been attained. The "distance-to-pulse out" converter 90 is a converter manufactured by Aerotech, Inc. for operation of the known micromachining stations.

As was described in previous paragraphs, change of the relative disposition between the laser beam, substrate and/or material carrier element, may be implemented in following three fashions:

movement of the substrate with respect to the immovable laser beam; scanning of the laser beam with regard to the substrate and/or material carrier element; and combinatorial motion of the substrate and the laser beam. Thus, when scanning of the laser beam with respect to the substrate and/or material carrier element is chosen for operation, the system 10 of the present invention will operate in accordance with FIG. 5, illustrating the motion/laser controller 53, particularly, a subsystem thereof for laser motion and laser actuation-deactuation control.

Figure 5:
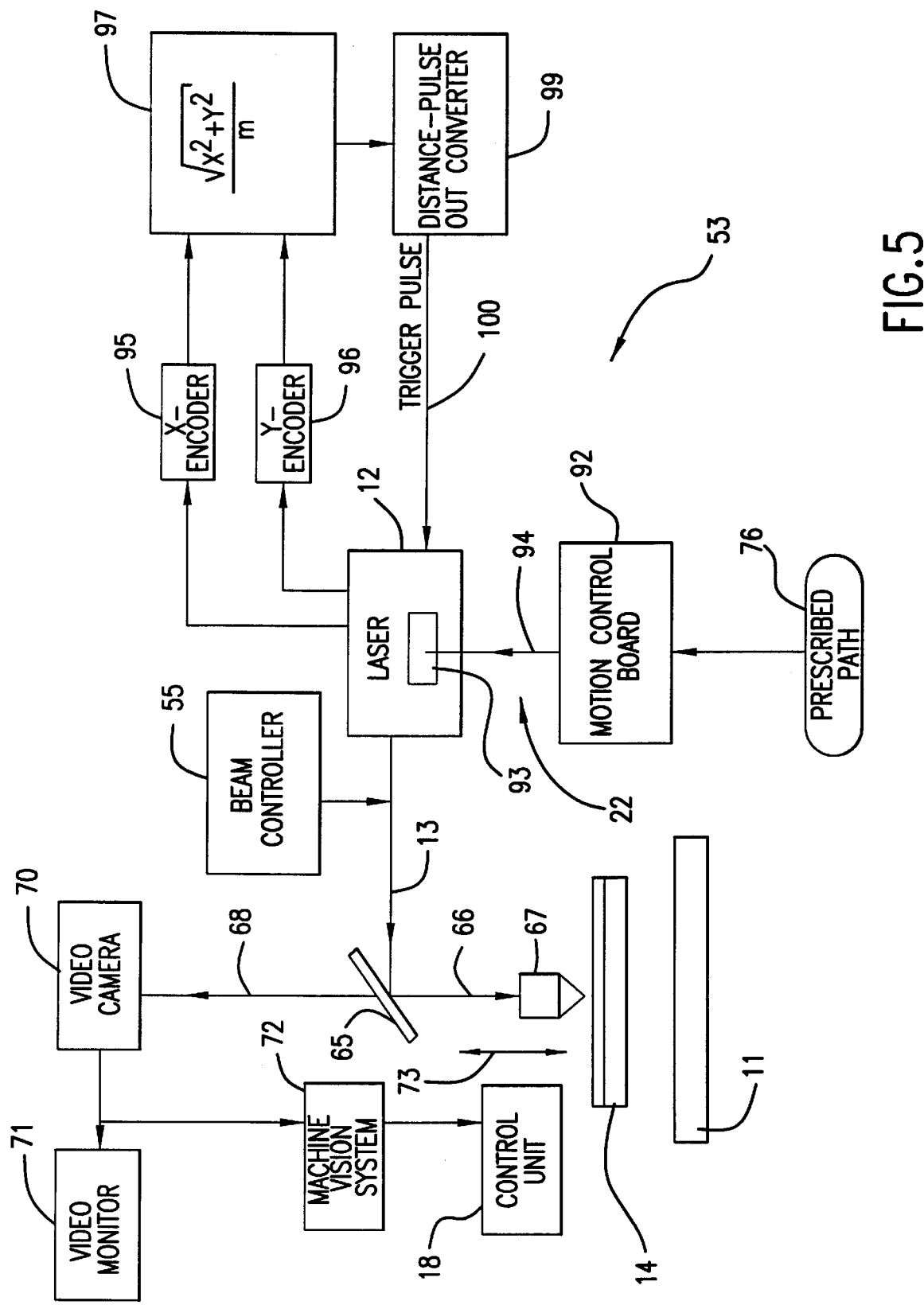
FIG. 5 is a block diagram of a controller subsystem for laser motion and laser actuation-deactuation control of the apparatus of the present invention.

As shown in FIG. 5, data representative of the prescribed path 76 are supplied to the motion control board 92 (which may coincide with the motion control board 77). The motion control board 92, in the manner described with respect to FIG. 4, transmits control signals over the line 94, either to the optical system of the laser 12 or to mechanical stages carrying the laser 12 for displacement of the laser beam generated by the laser 12, thus providing scanning of the laser beam over the surface of the material carrier element 14 or the substrate 11.

X and Y encoders 95 and 96, or other mechanisms sensing displacement of the scanning laser beam receive information from the "optical system/stages" 93 of the laser 12 and transmit this information to a processing block 97 which processes the information received from the encoder 95, 96 either in the same manner as the processing block 83 of FIG. 4, or in any other fashion known to those skilled in the art and then outputs the data representative of the displacement of the laser beam through the line 98 to the "distance-to-pulse out" converter 99 which in a well-known manner converts the data representative of the displacement of the scanning laser beam into the controlling trigger pulses which are supplied to the laser 12 through the line 100 for actuating/deactuating the laser 12.

The generated laser beam 13 is further controlled by the beam controller 55 and is further directed to the material carrier element 14 or the substrate 11 as described in the previous paragraphs. In this manner, the firing of the laser beam will be coordinated in precise fashion with the scanning of the laser beam with regard to the substrate 11 or the material carrier element 14.

Figure 6:
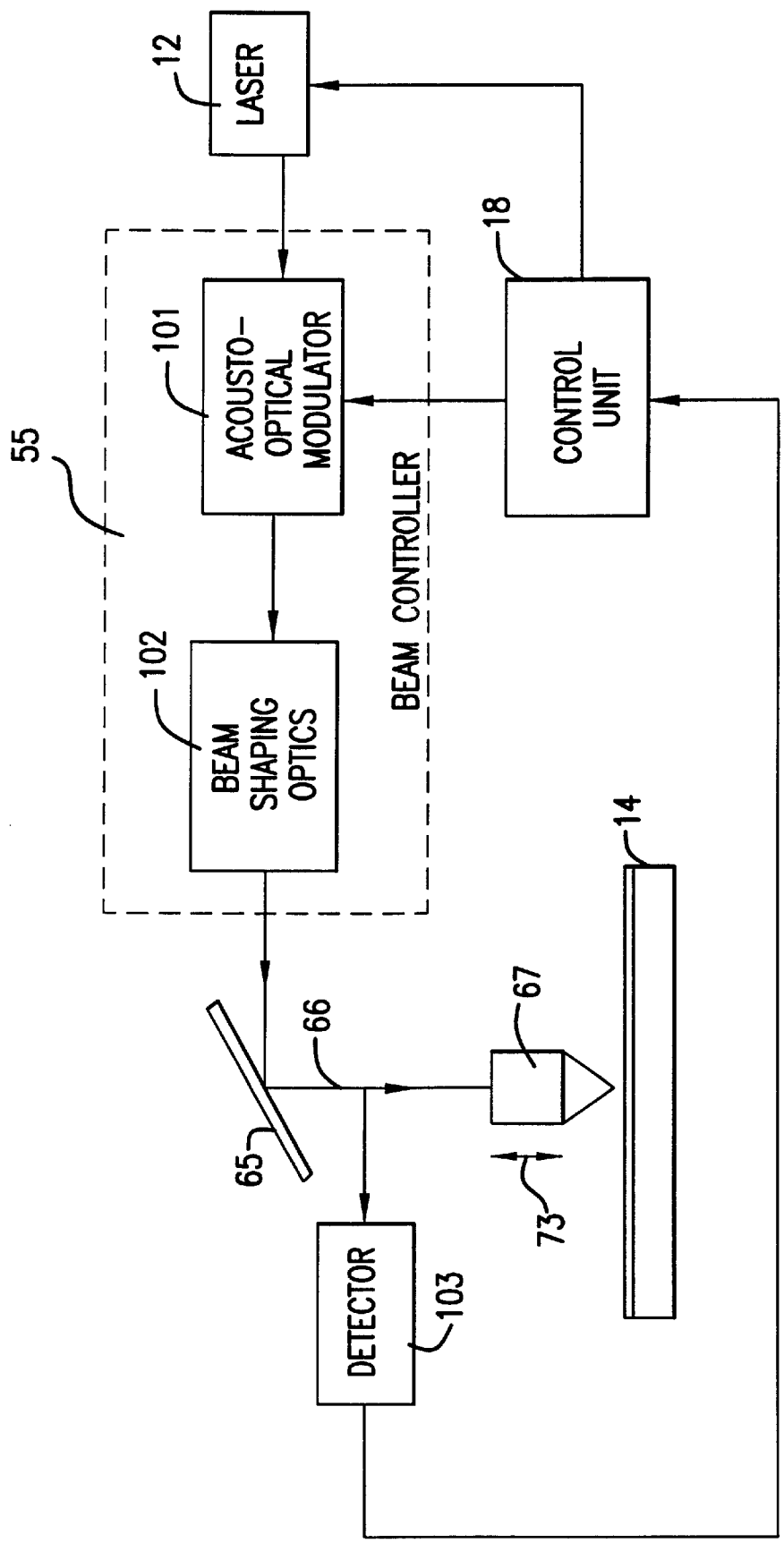
FIG. 6 is a block diagram of the beam control subsystem of the apparatus of the present invention.

Referring to FIG. 6, the beam controller 55 facilitates the delivery of the laser beam of the desired optimal laser spot size, shape, and fluence to the substrate or to the material carrier element. The beam controller 55 includes an acousto-optic modulator 101 coupled to the laser 12 to provide a convenient and efficient mode to rapidly (faster than 100 ms) shutter the laser "on" or "off" as well as to control the energy of the individual generated laser pulses dynamically. The acousto-optic modulator 101 external to the laser cavity allows the laser to run at constant repetition rate for maximum stability. Throughput efficiency of the acousto-optic modulator can be controlled by the motion/laser controller 53 in the range between 0% to more than 90%.

A beam shaping optical system 102 is coupled to the acousto-optic modulator 101 to control size and shape of the laser beam at the target. The beam shaping optics 102 25 includes an optical zoom shaped aperture array, and/or diffracted optic beam shaper.

The control of the power and generation of the laser beam is an important feature since fluences of the generated laser beam are to be maintained at different levels for different purposes. As an example for deposition, an optimal fluence is kept usually in the range of 0.2–2.0 J/Cm$^2$ per pulse. For ablation micromachining, generally high fluences are desired for maximum speed and efficiency, typically approximately 1–100 J/CM$^2$ per pulse. Lower fluences, approximately 0.2–2.0 J/CM$^2$ can be used for precise depth control. Using the structure of the system of the present invention, sub-micron depth control has been demonstrated.

The laser beam having the required fluence (provided by the acousto-optical modulator 101) and required size and shape (provided by the beam shaping optics 102) is further output to the splitter 65 for further displacement to the target (material carrier elements 14 or the substrate 11) through the objective 67. The objective 67 is provided for final imaging of the UV laser beam and video magnification. The objective 67 is mounted on a focusing stage providing displacement in the direction shown by arrows 73 to permit proper imaging regardless of the substrate height, regardless of whether the material carrier element is in the beam path.

A detector 103 monitors laser pulse energy and supplies data representative of the real time laser beam energy to the control unit 18 for closed loop control.

Figure 7:
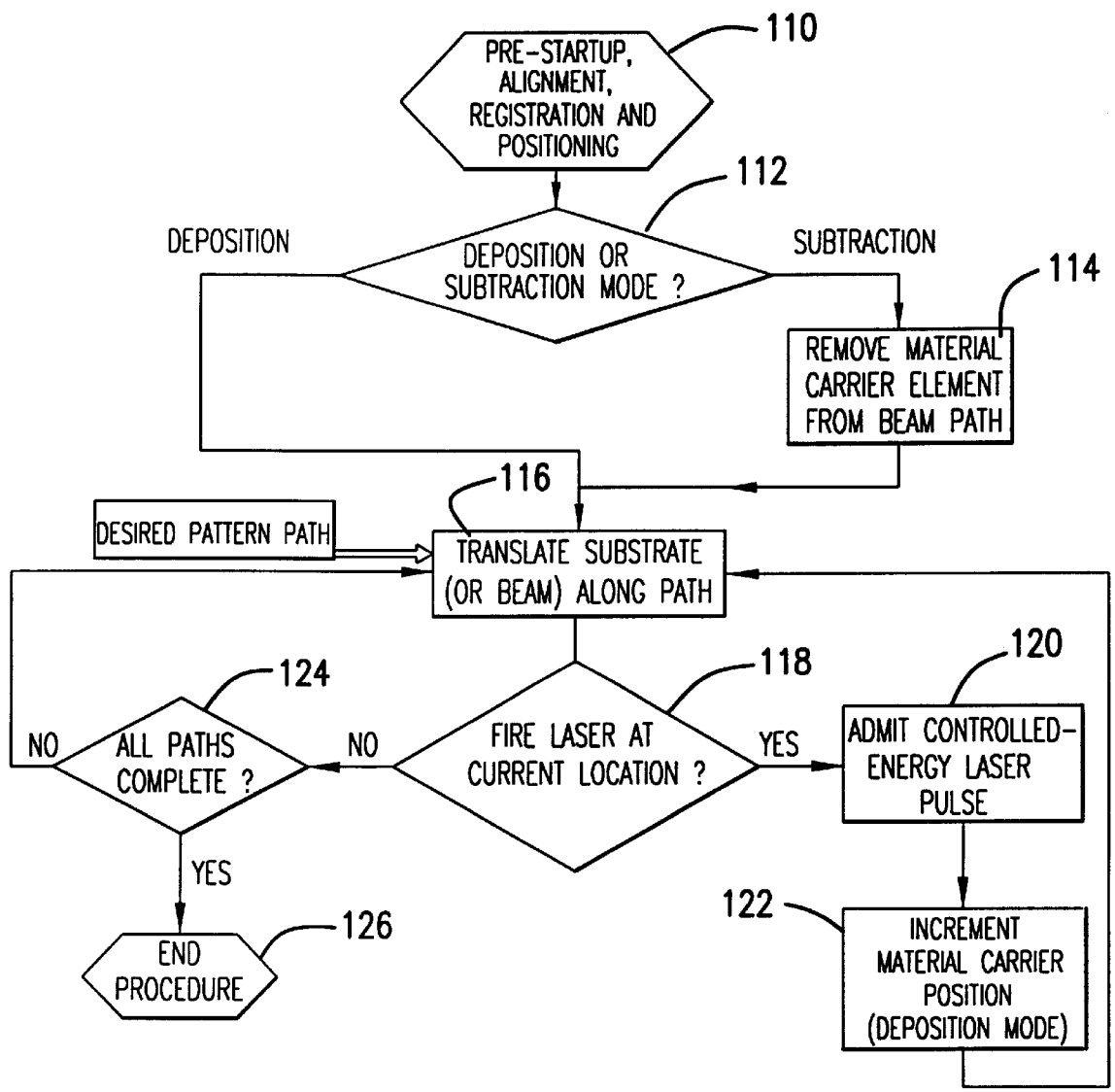
FIG. 7 is a flow chart diagram of the computer system operation of the control unit of the apparatus of the present invention.

Referring to FIG. 7, showing a block diagram of the computer operational principles of the control unit of the apparatus of the present invention, the flow chart is initiated in block 110 corresponding to the pre-start-up procedure which includes alignment of the elements (substrate, material carrier element, laser beam) of the system, registration and positioning. Initially, the material carrier element is maintained in interception position with the laser.

From the block 110, the signal logic is directed to decision block 112 "Deposition or subtraction mode?" If a subtraction ("material removal" mode of operation) is chosen, the logic moves to the block 114 "Remove material carrier element from the beam path". In accordance with the command of the block 114, the control unit 18 then outputs a control signal to mechanism 24, best shown in FIG. 3, for displacing the material carrier element 14 away from the interception position with the laser beam 13.

From the block 114, the logic moves to the block 116 "Translate substrate (or beam) along path".

If in the logic block 112, the deposition ("material transfer" mode of operation) has been chosen, the logic moves again to the block 116. The logic block 116 receives a desired pattern path which corresponds to the prescribed path 76 best shown in FIGS. 3–5. Thus, upon receiving the desired pattern path, the logic block 116 changes relative disposition between the substrate and the beam in accordance with the prescribed path.

From the block 116, the flow chart moves to the decision block 118 "Fire laser at current location?". If the laser is to be fired, i.e., the answer is "Yes", the logic moves to the block 120 "Admit controlled-energy laser pulse". At this time, the motion/laser controller 53, as best shown in FIGS. 3–5, "commands" the laser 12 to generate a laser pulse which impinges at a predetermined area of the substrate 11 (in the "material removal" mode of operation), or the material carrier element 14 (in the "material transfer" mode of operation). After the laser beam modifies either the deposition layer 15 of the material carrier element 14 or the surface of the substrate 11, the signal is directed to the logic block 122 "Increment materials carrier position (deposition mode)". In this instance, the control unit 18 deactuates the laser 12, thus seizing the laser beam, and moves the material carrier element 14 to the next position according to the prescribed path 76 if the apparatus 10 operates in the "materials transfer" mode of operation.

If however the apparatus 10 operates in the "material removal" mode of operation, the control unit 18 seizes or captures the laser beam and moves the substrate to the next position in accordance with the prescribed path 76. Thus, from the logic block 122, the flow chart returns to the logic block 116, where the translation of the substrate (or the laser beam) is performed along with prescribed path 76.

If however the answer to the logic block 118 is "No", meaning that the laser is not to be fired at a current location of the substrate or the laser beam, the logic flows to the decision block 124 "All Paths Complete?". If the answer is "Yes", the logic flows to the "End Procedure" block 126.

If however, in the logic block 124, it has been decided that not all prescribed paths have been yet completed, i.e., the answer is "No", the logic returns to the block 116 to translate the substrate (or the laser beam) along the prescribed path 76 for further leading the flow chart either along the loop comprised of logic blocks 118, 120, 122 and 116; or sequentially along the loop comprised of the logic blocks 118, 124, 116.

Known material compositions used in this invention which are transparent to laser beams include fuse silica, borosilicate glass, polyester films such as Mylar, acrylic, as well as a wide variety of other compositions known in the art.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method for fabrication of miniature structures, comprising the steps of:
   (a) providing a fabrication tool, including:
      a substrate,
      a controllable energetic beam directed towards said substrate,
      a deposition layer supported on a material carrier element, and
      control means operating said fabrication tool in either a material removal and material transfer mode of operation;
   (b) displacing said material carrier element away from intercepting with said energetic beam when said fabrication tool is in said material removal mode of operation, and
      controllably changing relative position between said energetic beam and said substrate, thereby removing a disintegratable material from the surface of said substrate in accordance with a predetermined pattern, and
   (c) maintaining said material carrier element intercepted with said energetic beam when said fabrication tool is in said material transfer mode of operation, and controllably changing relative position between said energetic beam and said substrate, thereby transferring a material contained in said deposition layer onto said substrate for deposition thereon in a patterned fashion.

2. The method of claim 1, wherein said energetic beam is a laser beam.

3. The method of claim 1, further including the steps of:
   operatively coupling said control means to said energetic beam for regulating parameters of said energetic beam, and for changing disposition of said energetic beam with respect to said substrate.

4. The method of claim 1, further including the steps of:
   operatively coupling said control means to said material carrier element for manipulating said material carrier element in accordance with a required mode of operation of said fabrication tool.

5. A method for fabrication of miniature structures, comprising the steps of:
   providing a substrate,
   providing a source of energy capable of generating an energetic beam,
   positioning a material carrier element in a gap formed between said substrate and said source of energy, said material carrier element having a deposition layer on a surface thereof facing said substrate and containing a depositable material to be deposited onto said substrate,
   operatively coupling a control means to said material carrier element and to said source of energy, and
   synchronously controlling said material carrier element and said source of energy in accordance with a miniature structures to be fabricated in either a material removal mode of operation or a material transfer mode of operation, displacing said material carrier element to said first position thereof external to an intercepting path with said energetic beam, and thereby allowing a direct access of said energetic beam to said substrate, and thereby causing disintegration in a patterned manner and to a predetermined depth thereof of the material on the surface of said substrate, and
   further displacing said material carrier element to said second position for interception with said energetic beam path, thereby causing modification of said deposition layer at a predetermined location and transferring the material contained in said deposition layer onto said substrate to be deposited at a predetermined area thereof when in said material transfer mode of operation.

6. The method of claim 5, further including the steps of:
   generating said energetic beam,
   forwarding said energetic beam in a direction towards said substrate,
   displacing said material carrier element to a first position thereof in said gap corresponding to said material removal mode of operation,
   displacing said material carrier element to a second position thereof in said gap corresponding to said material transfer mode of operation, and
   in either of said material transfer and material removal modes of operation, controlling a relative interposition between said energetic beam and said substrate in accordance with a predetermined pattern.

7. The method of claim 5, further including the step of:
   creating an electrical via in said substrate in said material removal mode of operation.

8. The method of claim 5, further including the step of:
   forming a micromachined channel in said material removal mode of operation.

9. The method of claim 5 further including the steps of:
depositing a material on the surface of said substrate prior to said material removal mode of operation, and disintegrating said priorly deposited material on the surface of said substrate by said energetic beam according to a predetermined pattern during said material removal mode of operation.

10. The method of claim 5, further including the steps of regulating a size of the cross-section of said energetic beam.

11. The method of claim 5, further including the steps of regulating the shape of the cross-section of said energetic beam.

12. The method of claim 5, further including the step of regulating the fluence of said energetic beam.

13. The method of claim 5, further including the step of pulsing said source of energy at predetermined time intervals.

* * * * *